(12) United States Patent
Matsubara et al.

(10) Patent No.: US 8,309,952 B2
(45) Date of Patent: Nov. 13, 2012

(54) THIN FILM TRANSISTOR AND METHOD FOR MANUFACTURING THE SAME

(75) Inventors: Ryohei Matsubara, Tokyo (JP); Mamoru Ishizaki, Tokyo (JP)

(73) Assignee: Toppan Printing Co., Ltd. (JP)

( * ) Notice: Subject to any disclaimer, the term of this patent is extended or adjusted under 35 U.S.C. 154(b) by 605 days.

(21) Appl. No.: 12/070,944

(22) Filed: Feb. 21, 2008

(65) Prior Publication Data

US 2009/0057656 A1    Mar. 5, 2009

(30) Foreign Application Priority Data

Aug. 28, 2007 (JP) ................. 2007-220721

(51) Int. Cl.
*H01L 51/00* (2006.01)
(52) U.S. Cl. ............... 257/40; 257/E51.006; 257/E21.7
(58) Field of Classification Search .............. 257/40, 257/E51.006, E21.7; 438/99
See application file for complete search history.

(56) References Cited

U.S. PATENT DOCUMENTS

| | | | | |
|---|---|---|---|---|
| 6,774,393 B2 * | 8/2004 | Murti et al. | | 257/40 |
| 7,078,702 B2 * | 7/2006 | Ringermacher et al. | | 250/370.11 |
| 2005/0056897 A1 * | 3/2005 | Kawasaki et al. | | 257/359 |
| 2008/0003727 A1 * | 1/2008 | Jinbo | | 438/149 |
| 2008/0012009 A1 * | 1/2008 | Hashizume et al. | | 257/40 |
| 2008/0128680 A1 * | 6/2008 | Anthony et al. | | 257/40 |
| 2008/0128685 A1 * | 6/2008 | Honda et al. | | 257/40 |
| 2009/0111211 A1 * | 4/2009 | Kim et al. | | 438/99 |
| 2009/0322210 A1 * | 12/2009 | Yokoo | | 313/504 |

FOREIGN PATENT DOCUMENTS

JP      2000-174277      6/2000

OTHER PUBLICATIONS

Francis Garnier et al., "All-Polymer Field-Effect Transistor Realized by Printing Techniques", *Science*, vol. 265, Sep. 16, 1994, pp. 1684-1686.

* cited by examiner

*Primary Examiner* — Matthew Landau
*Assistant Examiner* — Colleen E Snow
(74) *Attorney, Agent, or Firm* — Squire Sanders (US) LLP

(57) ABSTRACT

One embodiment of the present invention is a thin film transistor, including: an insulating substrate; a gate electrode and a gate insulator being formed on the insulating substrate, in this order; a source electrode and a drain electrode formed on the gate insulator, surface preparation of the source electrode and the drain electrode being performed with a compound having a functional group with an electron-withdrawing property; and a semiconductor film formed on the gate insulator, the film being formed between the source electrode and the drain electrode.

6 Claims, 15 Drawing Sheets

(a)

(b)

(c)

(d)

(e)

(a)

(b)

(c)

(d)

(e)

|  | Work function [eV] |
|---|---|
| Example 1 | 5.40 |
| Example 2 | 5.74 |
| Example 3 | 5.49 |
| Example 4 | 5.26 |
| Example 5 | 6.00 |
| Comparative Example 1 | 4.75 |
| Comparative Example 2 | 4.74 |
| Comparative Example 3 | 4.60 |

Fig.14

| | A mobility of a carrier [cm$^2$/Vs] |
|---|---|
| Example 1 | 2.82 E-03 |
| Example 2 | 2.06 E-03 |
| Example 3 | 2.29 E-03 |
| Example 4 | 1.66 E-03 |
| Example 5 | 2.23 E-03 |
| Comparative Example 1 | 3.26 E-04 |
| Comparative Example 2 | 9.92 E-04 |
| Comparative Example 3 | 2.05 E-03 |

Fig.15

THIN FILM TRANSISTOR AND METHOD FOR MANUFACTURING THE SAME

CROSS REFERENCE TO RELATED APPLICATION

This application is based on and claims the benefit of priority from the Japanese Patent Application number 2007-220721, filed on Aug. 28, 2007; the entire contents of which are incorporated herein by reference.

BACKGROUND OF THE INVENTION

1. Field of the Invention

The present invention is related to a thin film transistor and a method for manufacturing the thin film transistor, the transistor being able to be used in a driving device of various image display devices, a logic device of various logic circuits or the like.

2. Description of the Related Art

With the remarkable development of information technology, presently, information is frequently sent or received using a mobile information terminal, a notebook computer and the like. It is well-known that, in the near future, the ubiquitous society will be realized in which information is sent or received from any place. In such a society, a thinner and lighter information terminal is desired.

Currently, various image display devices and various logic circuits are incorporated in an information terminal. A thin film transistor is used for most of their driving devices and logic devices.

Currently, the main stream of a semiconductor material is silicon type (Si type). However, the research and development of the transistor using an organic semiconductor (the organic transistor) has become active in light of improving flexibility, reducing weight and cost. Generally, in the case of using an organic semiconductor, because it is possible to process in a wet state, there are some advantages such as increasing the size as much as possible, being able to adopt a printing method and being able to use a plastic substrate. (See non-patent document 1.)

In addition, the application field of the organic semiconductor is wide, and is not limited to the above-mentioned thin and light flexible display. The application of the organic semiconductor to RFID (radio frequency identification) tag or a sensor is expected. In this way, the research and development of the organic transistor is necessary for the ubiquitous society.

For these reasons, an organic semiconductor which is formed by a printing method is currently attracting attention. However, currently, the mobility of a carrier of a field-effect transistor using an organic semiconductor is low, for example $10^{-2}$-$10^{-4}$ cm$^2$/Vs order and the organic semiconductor has not reached a sufficient level for practical use. Therefore, development of the organic semiconductor in various points such as an organic semiconductor material, an electrode material, a device constitution and a manufacturing process is rapidly needed.

Among these problems, a problem in an interface between a semiconductor and an electrode is important. The characteristics of a transistor largely change depending on whether a carrier can be efficiently injected from an electrode to a semiconductor or not. At present, most compounds used for an organic semiconductor are p-type semiconductors in which the carrier is a hole. Therefore, it is desirable that the work function of an electrode be large in order to allow an ohmic contact. Further, it is desirable that the work function of an electrode be larger than the work function of a semiconductor. The work function of a p-type organic semiconductor is about 5.0-5.5 eV. It has been found that the use of a metal material such as platinum (5.65 eV) and gold (5.1 eV), and a conductive polymer material such as poly (ethylenedioxy thiophen)/polystyrene sulfonate (PEDOT/PSS) (5.0 eV) and polyaniline (4.9 eV), as an electrode material having a high work function, can allow the efficiency of carrier injection to be increased.

In one example, a thin film transistor using gold or platinum having a high work function for a source electrode and a drain electrode is manufactured (See patent document 1.)

However, the variety of metal materials having a high work function is few and the material is rare. Therefore, it is difficult to manufacture an organic transistor having an efficient carrier injection that can be manufactured from a wide range of electrode materials.

[Patent document 1] JP-A-2000-174277

[Non-patent document 1] Science Vol. 265, 1684 (1994)

SUMMARY OF THE INVENTION

One embodiment of the present invention is a thin film transistor, including: an insulating substrate; a gate electrode and a gate insulator being formed on the insulating substrate, in this order; a source electrode and a drain electrode formed on the gate insulator, surface preparation of the source electrode and the drain electrode being performed with a compound having a functional group with an electron-withdrawing property; and a semiconductor film formed on the gate insulator, the film being formed between the source electrode and the drain electrode.

BRIEF DESCRIPTION OF THE DRAWINGS

FIG. 14 is a table showing work functions of source electrodes and drain electrodes in Examples and Comparative Examples.

FIG. 15 is a table showing carrier mobility of thin film transistors in Examples and Comparative Examples.

Figure 1:
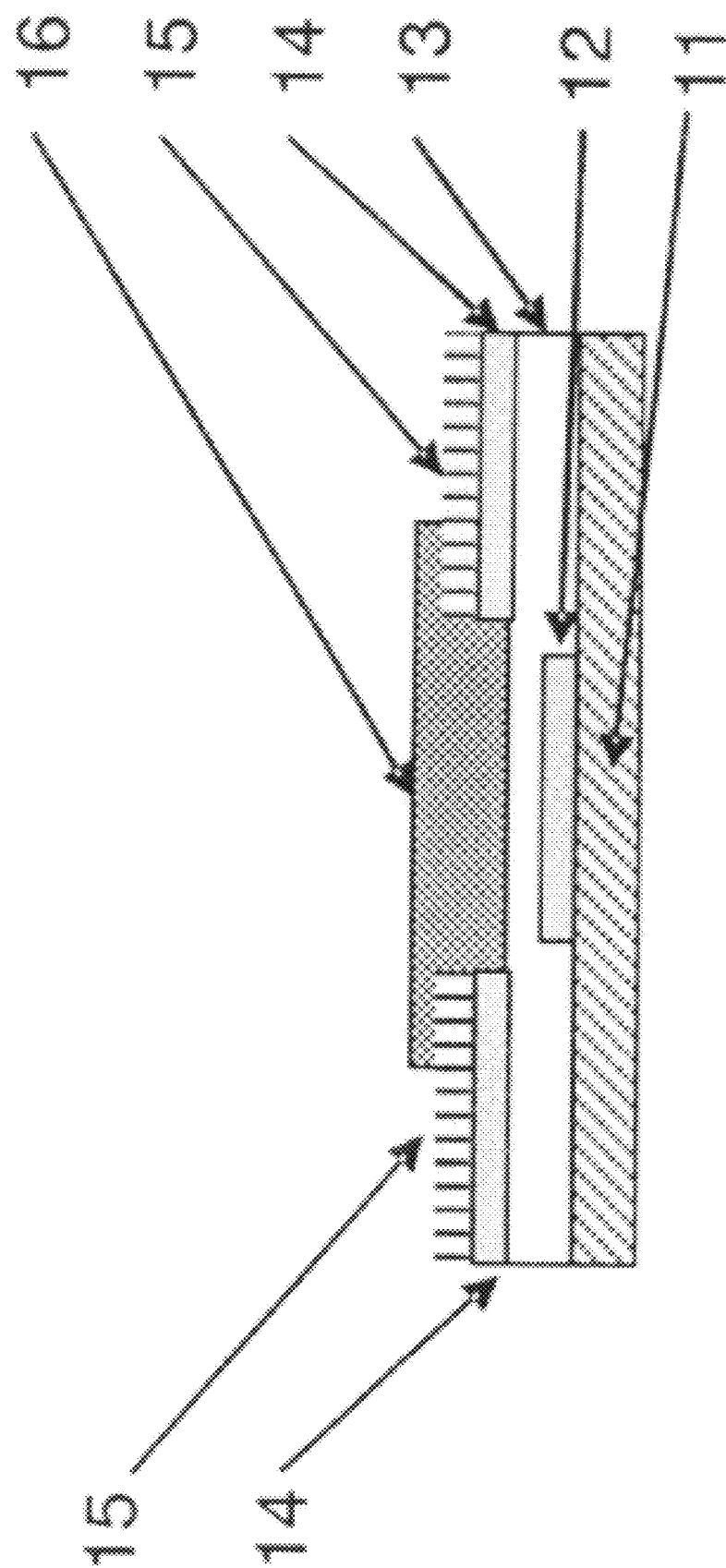
FIG. 1 is a cross-sectional diagram of an example of a thin film transistor of the present invention.

In these drawings, 11 is an insulating substrate; 12 is a gate electrode; 13 is a gate insulator; 14 is a source electrode and a drain electrode; 15 is a surface preparation agent; 16 is a semiconductor film; 21 is a blanket; 22 is an ink liquid film; 23 is a relief printing plate; 24 is an unnecessary part of an ink liquid film; 31 is a gate insulator material; 32 is a die coater; 41 is a source electrode material and a drain electrode material; 42 is a screen printing apparatus; 51 is a container; 52 is a surface preparation agent solution; 61 is a dispenser; and 62 is a semiconductor material.

DETAILED DESCRIPTION OF THE INVENTION

The objective of the present invention to provide a thin film transistor and a method for manufacturing a thin film transistor, the transistor having an efficient carrier injection and an electrode material that can be manufactured from a wide range of electrode materials.

The present invention according to claim 1 is a thin film transistor, having: an insulating substrate; a gate electrode and a gate insulator being formed on the insulating substrate, in this order; a source electrode and a drain electrode formed on the gate insulator, surface preparation of the source electrode and the drain electrode being performed with a compound having a functional group with an electron-withdrawing property; and a semiconductor film formed on the gate insulator, the film being formed between the source electrode and the drain electrode.

In the case where surface preparation of the source electrode and the drain electrode is performed with a compound having a functional group with an electron-withdrawing property, work functions of the source electrode and the drain electrode can be made high even if a rare metal material is not used. Therefore, an electrode material can be widely selected from various materials and a thin film transistor with an efficient carrier injection can be obtained. Since surface preparation is performed using a compound having a functional group with an electron-withdrawing property, electrons in each respective electrode are attracted into a compound having a functional group with an electron-withdrawing property. Therefore, the number of electrons in respective electrodes is reduced and thereby work functions of the respective electrode become higher.

The present invention according to claim 2 is the thin film transistor according to claim 1, wherein the compound having the functional group with the electron-withdrawing property includes one compound from any one of the following compounds; a thiol compound, a disulfide compound, a sulfide compound and a silane coupling agent.

In the case where a compound having a functional group with an electron-withdrawing property includes any one of the above stated compounds, namely, a thiol compound, a disulfide compound, a sulfide compound and a silane coupling agent, adhesion to the source electrode and the drain electrode is improved. Work functions of the source electrode and the drain electrode can be kept high over a long time and a thin film transistor having a stable and highly efficient carrier injection over time can be obtained.

The present invention according to claim 3 is the thin film transistor according to claim 1, wherein the source electrode and the drain electrode are chemically coupled with the compound having the functional group with the electron-withdrawing property.

In the case where the source electrode and the drain electrode are chemically coupled with the compound having the functional group with the electron-attraction property, work functions of the source electrode and the drain electrode can be kept high for a long time. Thereby, a thin film transistor having a stable and highly efficient carrier injection over time can be obtained.

The present invention according to claim 4 is the thin film transistor according to claim 1, wherein the source electrode and the drain electrode include at least one of Au and Ag.

In the case where the source electrode and the drain electrode include at least one of Au and Ag, a thin film transistor having a highly efficient carrier injection can be obtained, the transistor having the source electrode and the drain electrode with a high work function without a rare metal. In addition, in the case where a compound having a functional group with an electron-withdrawing property includes at least one of the compounds, a thiol compound, a disulfide compound, a sulfide compound and a silane coupling agent, a metal material such as Au and Ag is chemically coupled with these compounds having a functional group with an electron-withdrawing property by an Au-thiol reaction or an Ag-thiol reaction. The work function of an electrode can be kept high for a long time and thereby, a thin film transistor having a stable highly efficient carrier injection over time can be obtained.

The present invention according to claim 5 is the thin film transistor according to claim 1, wherein the semiconductor film is a p-type semiconductor film.

In the case where work functions of the source electrode and the drain electrode are high, the use of a p-type semiconductor film as a semiconductor film is effective to obtain a thin film transistor having a highly efficient carrier injection.

The present invention according to claim 6 is the thin film transistor according to claim 1, wherein the semiconductor film is an organic semiconductor film.

In the case where a semiconductor film is an organic semiconductor film, a large-sized flexible thin film transistor (substrate) can be obtained.

The present invention according to claim 7 is the thin film transistor according to claim 1, wherein the insulating substrate is a flexible substrate.

In the case where the insulating substrate is a flexible substrate, a thin, light and flexible thin film transistor can be obtained.

The present invention according to claim 8 is a method for manufacturing a thin film transistor, including: a first step of forming a gate electrode on an insulating substrate; a second step of forming a gate insulator on the gate electrode; a third step of forming a source electrode and a drain electrode on the gate insulator; a forth step of performing a surface preparation of the source electrode and the drain electrode with a compound having a functional group with an electron-withdrawing property; and a fifth step of forming a semiconductor film on the gate insulator, the film being between the source electrode and the drain electrode.

In the case where surface preparation of the source electrode and the drain electrode with a compound having a functional group with an electron-withdrawing property is performed, a thin film transistor having a highly efficient carrier injection can be obtained, the transistor having the source electrode and the drain electrode with a high work function without a rate metal. Since surface preparation is performed using a compound having a functional group with an electron-withdrawing property, the electrons in each electrode are attracted into a compound having a functional group with an electron-withdrawing property. Therefore, the number of electrons in respective electrodes is reduced and thereby work functions of the respective electrode become high.

The present invention according to claim 9 is the method for manufacturing the thin film transistor according to claim

8, wherein the compound having a functional group with an electron-withdrawing property includes at least one of the compounds, namely, a thiol compound, a disulfide compound, a sulfide compound and a silane coupling agent.

In the case where surface preparation is performed using the compound having a functional group with an electron-withdrawing property including any one of the compounds, a thiol compound, a disulfide compound, a sulfide compound and a silane coupling agent, adhesion to a source electrode and a drain electrode is improved. Thereby, work functions of a source electrode and a drain electrode can be kept high over a long-time. Therefore a thin film transistor having a stable and highly efficient carrier injection over time can be obtained.

The present invention according to claim 10 is the method for manufacturing the thin film transistor according to claim 8, wherein the source electrode and the drain electrode are formed by a material including at least one of Au and Ag.

In the case where the source electrode and the drain electrode are formed by a material including at least one of Au and Ag, a thin film transistor can be manufactured, the transistor having the source electrode and the drain electrode with a high work function without a rare metal. In addition, in the case where a compound having a functional group with an electron-withdrawing property includes at least one of the compounds, a thiol compound, a disulfide compound, a sulfide compound and a silane coupling agent, a metal material such as Au and Ag is chemically coupled with these compounds having a functional group with an electron-withdrawing property by an Au-thiol reaction or an Ag-thiol reaction. The work function of an electrode can be kept high for a long time. Thereby, a thin film transistor having a stable and highly efficient carrier injection over time can be manufactured.

The present invention according to claim 11 is the method for manufacturing the thin film transistor according to claim 8, wherein the semiconductor film is a p-type semiconductor film.

In the case where work functions of a source electrode and a drain electrode are high, the formation of a p-type semiconductor film is more effective in order to manufacture a thin film transistor having an efficient carrier injection.

The present invention according to claim 12 is the method for manufacturing the thin film transistor according to claim 8, wherein the semiconductor film is an organic semiconductor film.

The formation of an organic semiconductor film can allow a large-sized flexible and thin film transistor to be manufactured.

The present invention according to claim 13 is the method for manufacturing the thin film transistor according to claim 8, wherein the source electrode and the drain electrode are formed by a printing method.

The formation of a source electrode and a drain electrode by a printing method can allow a large-sized thin film transistor to be manufactured efficiently in the use of an electrode material.

The present invention according to claim 14 is the method for manufacturing the thin film transistor according to claim 13, wherein the printing method is a screen printing method, an ink-jet method, a flexo method or reverse type offset printing method.

The formation of a source electrode and a drain electrode by any one of the methods, namely, a screen printing method, an ink-jet method, a flexo method and reverse type offset printing method can allow a large-sized thin film transistor to be manufactured efficiently in the use of an electrode material.

Hereinafter, embodiments of the present invention are described referring to figures, however the present invention is not limited to these embodiments.

FIG. 1 shows an example of a thin film transistor of the present invention. A gate electrode 12, a gate insulator 13, a source electrode and a drain electrode 14, and a semiconductor film 16 are formed on an insulating substrate 11. The feature of this embodiment is a source electrode and a drain electrode in which surface preparation is performed with a surface preparation agent 15.

In the case where surface preparation of a source electrode and a drain electrode 14 is performed using a compound having a functional group with an electron-withdrawing property in this way, work functions of a source electrode and a drain electrode 14 can be increased, thereby efficiency in a carrier injection can be improved. Since surface preparation is performed using a compound having a functional group with an electron-withdrawing property, electrons in each electrode are attracted into a compound having a functional group with an electron-withdrawing property. Therefore, the number of electrons in respective electrodes is reduced and thereby work functions of the respective electrode become high.

Figure 2:
FIGS. 2(a)-(e) is an example of a method for manufacturing a thin film transistor of the present invention.
Figure 2:
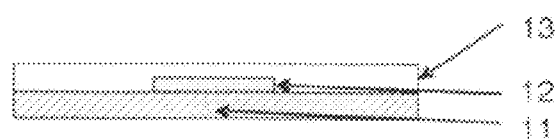
Figure 2:
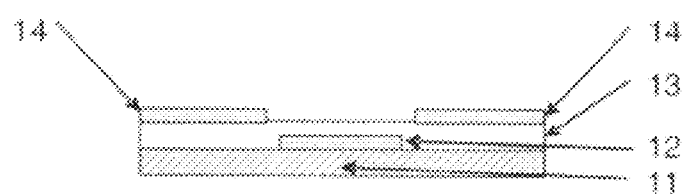
Figure 2:
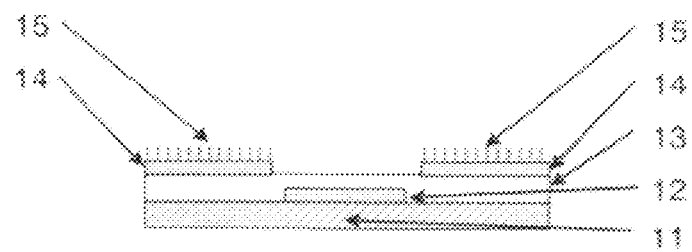
Figure 2:
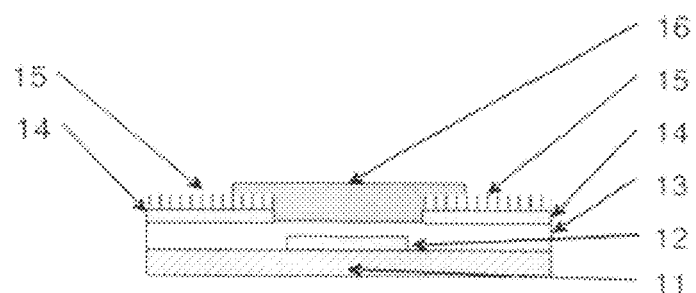

Next, an example of a method for manufacturing a thin film transistor of the present invention is shown in FIGS. 2(*a*)-(*e*). At first, a gate electrode 12 is formed on an insulating substrate 11 (FIG. 2(*a*)). Known plastic film such as polyethylene terephthalate (PET), polyethersulfone (PES), polyethylenenaphthalate (PEN), polyimide (PI), polyetherimide (PEI), polystyrene (PS), polyvinyl chloride (PVC), polyethylen (PE), polypropylene (PP), nylon and polycarbonate, as well as a glass substrate such as quarts and a silicon wafer, can be used for an insulating substrate 11.

If a flexible substrate such as a plastic film is used, a thin, light and flexible thin film transistor can be preferably obtained. In addition, if the manufacturing method includes a heating treatment such as a drying process, PES and PEN as a plastic film, as well as a glass substrate such as quartz having high stability to heat, are preferred.

A method for manufacturing a gate electrode 12 and a material used for a gate electrode are not limited. Examples of methods for manufacturing the gate electrode 12 include a photolithography method, a dispenser method, a screen printing method, an ink-jet method, a flexo printing method and reverse type offset printing method. Examples of materials for the gate electrode 12 include a solution in which a metal colloid particle such as Au, Ag and nickel is dispersed, and a thick film paste in which a metal particle such as Ag is used as a conductive material.

In addition, for example, a metal, an alloy or a transparent conductive film material is deposited on the entire surface by a sputtering or an evaporation method. Thereafter, a desired resist pattern is formed by a photolithography or a screen printing method using a resist material such as a novolac type or acrylic type. Thereafter, a desired pattern can be formed by etching using an etchant such as an acid. In addition, a desired pattern can be directly formed by a sputtering or an evaporation using a mask using a metal, an alloy and a transparent conductive film material. In the sputtering or the evaporation, aluminium, molybdenum, chromium, titanium, tantalum, nickel, copper, silver, gold, platinum and palladium can be used for the metal material, and ITO or the like can be used for the transparent conductive film material.

Next, a gate insulator 13 is formed (FIG. 2(*b*)). The material used for the gate electrode 13 and a method for forming the gate electrode 13 is not limited. For example, a high molecular solution of polyvinylphenol, polymethyl methacrylate, polyimide, polyvinyl alcohol or the like, and a solution in which a particle such as alumina and silicagel is dispersed can be used as a material. The gate insulator 13 can be formed by a spin coat method or a die coat method using these materials. In addition, the gate insulator 13 can be formed by a sputtering method, a plasma CVD method and an evaporation method using various insulating materials such as $SiO_2$, SiN, SiON and $Al_2O_3$.

Next, a source electrode and a drain electrode 14 are formed (FIG. 2(c)). A method for forming the electrode 14 and a material used for the electrode 14 are not limited. For example, a photolithography method, a dispenser method, a screen printing method, an ink-jet method, a flexo method and a reverse type offset printing can be used. Examples of materials for the electrode 14 include a solution in which a metal colloid particle such as Au, Ag and nickel is dispersed, and a thick film paste in which a metal particle such as Ag is used as a conductive material.

In addition, for example, a metal, an alloy or a transparent conductive film material is deposited on the entire surface by a sputtering or an evaporation method. Thereafter, a desired resist pattern is formed by a photolithography or a screen printing method using a resist material such as a novolac type or acrylic type. Thereafter, a desired pattern can be formed by etching using an etchant such as an acid. In addition, a desired pattern can be directly formed by a sputtering or an evaporation using a mask using a metal, an alloy and a transparent conductive film material. In the sputtering or the evaporation, aluminium, molybdenum, chromium, titanium, tantalum, nickel, copper, silver, gold, platinum and palladium can be used for the metal material, and ITO or the like can be used for the transparent conductive film material.

In addition, a printing method is preferable as a method for forming the electrode 14 because a large-sized thin film transistor substrate can be manufactured while efficiency in the use of the material is high. Further, the electrode 14 is preferably formed by any one of the methods, a screen printing method, an ink-jet method, a flexo method and a reverse type offset printing because efficiency in the use of the material is higher.

Figure 3:
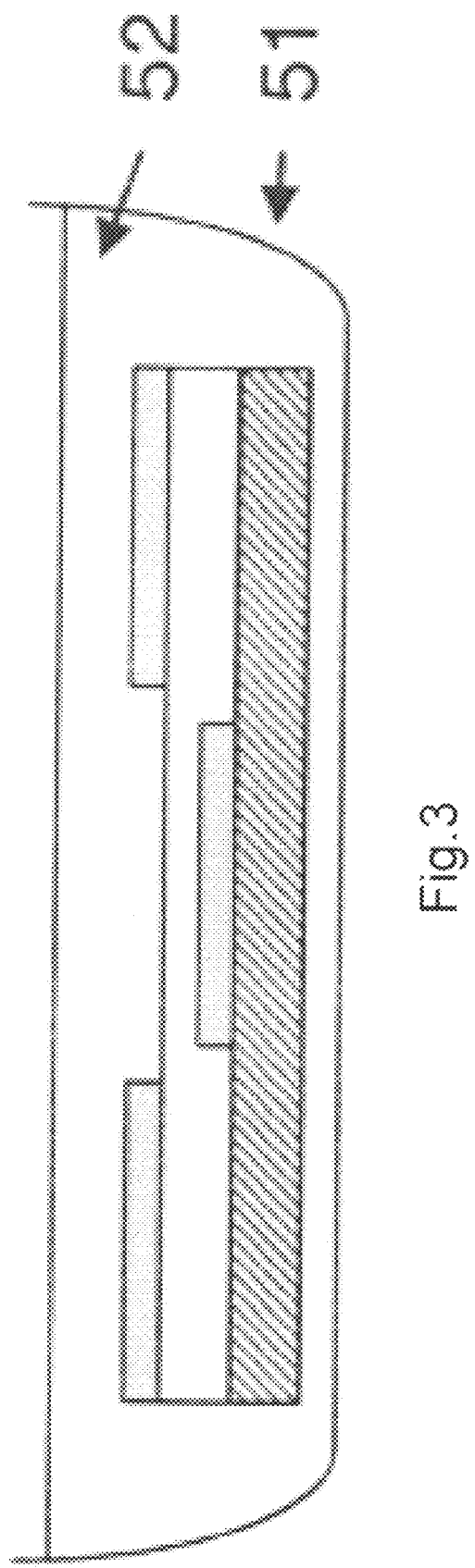
FIG. 3 is an example of a method for manufacturing a thin film transistor of the present invention.
Figure 4:
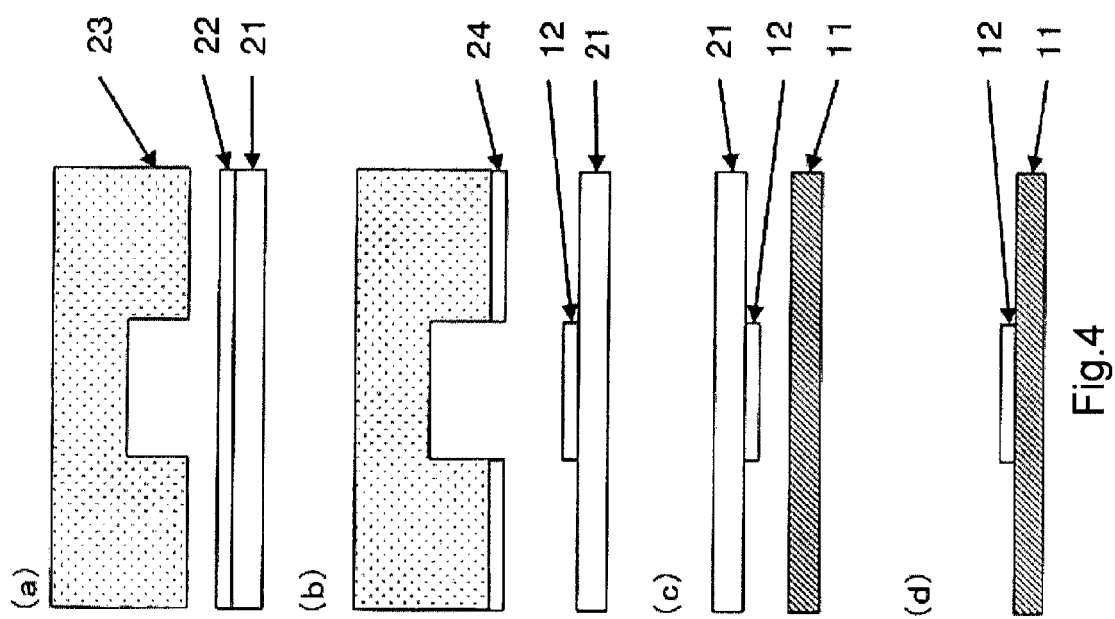
FIGS. 4(a)-(d) are an example of a method for manufacturing a thin film transistor of the present invention.

Next, surface preparation of the source electrode and the drain electrode 14 is performed with a compound having a functional group with an electron-withdrawing property. The compound having the functional group with the electron-withdrawing property is not especially limited. However, for example, thiol compounds such as benzenethiol, chlorobenzenethiol, bromo benzenethiol, fluorobenzenethiol, pentafluoro benzenethiol, pentachlorobenzenethiol, nitrothiophenol, 2-mercapto-5-nitro benzimidazole, perfluorodecanethiol, pentafluorothiophenol, 4-trifluoromethyl-2,3,5,6-tetrafluorothiophenol, 5-chloro-2-mercaptobenzimidazole, disulfide compounds such as diphenyl disulfide, sulfide compounds such as diphenyl sulfide and silane coupling agents such as long-chain fluoroalkylsilane can be used. In addition, the following surface preparation methods can be used, however they are not limited to these; dipping electrode 14 in a solution 52 in which the above-mentioned compound is diluted with a solvent such as alcohol of methanol, ethanol and isopropyl alcohol, the solution 52 being in a container 51 (FIG. 3); various wet coating methods such as a spray method in which the compound is sprayed on the electrode 14; and various dry coating methods such as an evaporation.

A thiol compound, a disulfide compound, a sulfide compound and a silane coupling agent are preferable for a compound having a functional group with an electron-withdrawing property since these compound have a high adhesion with the source electrode and the drain electrode.

Further, it is desirable that a compound having a functional group with an electron-withdrawing property is chemically coupled with the source electrode and the drain electrode. If a compound having a functional group with an electron-withdrawing property is chemically coupled with the source electrode and the drain electrode, work functions of the source electrode and the drain electrode can be kept high for a long time. Thereby, a thin film transistor having a stable and highly efficient carrier injection over time can be preferably obtained.

For example, when electrode materials for a source electrode and a drain electrode include at least one of Au and Ag, and a compound having a functional group with an electron-withdrawing property includes at least one of the compounds, a thiol compound, a disulphide compound, a sulfide compound and a silane coupling agent, the following chemical coupling can be formed: a chemical coupling by an Au-thiol reaction of a thiol compound, a disulfide compound and a sulfide compound with an Au electrode; and a chemical coupling by an Ag-thiol reaction of a thiol compound, a disulphide compound, a sulfide compound and a silane coupling agent with an Ag electrode.

Next, a semiconductor film 16 is formed (FIG. 2(e)). A method for forming the semiconductor film 16 and a material used for the semiconductor film 16 are not limited. In the case where the work function of a source electrode and a drain electrode are high, the use of a p-type semiconductor is effective in order to obtain a thin film transistor having a highly efficient a carrier injection. However, the semiconductor film is not limited to the p-type semiconductor. In addition, for example, an organic semiconductor can be preferably used in order to obtain a large-sized flexible and thin film transistor. Examples of the organic semiconductor materials include high molecular organic semiconductor materials such as polythiophene, polyallylamine, fluorene-bithiophene copolymer, and derivatives thereof, and low molecular organic semiconductor materials such as pentacene, tetracene, cupper phthalocyanine, perylene, and derivatives thereof can be employed. In addition, carbon compounds such as carbon nano-tube and fullerene, and a semiconductor nano particle dispersion solution can also be used as a semiconductor material. A printing method is a method for forming an organic semiconductor, the method having high efficiency in the use of the material. An ink-jet method and a dispenser method are preferable, but not limited to these.

In addition, a thin film transistor of the present invention can be preferably provided with a sealing (encapsulation or passivation) layer, a light shielding layer or the like as required.

According to the present invention, since surface preparation of a source electrode and a drain electrode is performed with a compound having a functional group with an electron-withdrawing property, work functions of the source electrode and the drain electrode can be made high even if a rare metal material is not used. Therefore, an electrode material can be widely selected from various materials and a thin film transistor having a highly efficient carrier injection can be obtained.

Further, a compound having a functional group with an electron-withdrawing property includes at least one of the compounds, a thiol compound, a disulfide compound, a sulfide compound and a silane coupling agent. Thereby, adhesion to the source electrode and the drain electrode is improved. Work functions of the source electrode and the drain electrode can be kept high over a long time and a thin film transistor having a stable and highly efficient carrier injection over time can be obtained.

Further, in the case where a compound having a functional group with an electron-withdrawing property is chemically coupled with a source electrode and a drain electrode, work functions of the source electrode and the drain electrode can be kept high over a longer time and a thin film transistor having a stable and highly efficient carrier injection over time can be obtained.

Further, in the case where a source electrode and a drain electrode include at least one of Au and Ag, a thin film transistor having a highly efficient carrier injection with the source electrode and the drain electrode of high work functions can be obtained even if a rare metal is not used. In addition, in the case where a compound having a functional group with an electron-withdrawing property includes at least one of the compounds, a thiol compound, a disulfide compound, a sulfide compound and a silane coupling agent, Au or Ag included in an electrode material can be chemically coupled with these compounds having a functional group with an electron-withdrawing property.

In addition, in the case where a method for manufacturing a thin film transistor includes a first step of forming a gate electrode on an insulating substrate; a second step of forming a gate insulator on the gate electrode; a third step of forming a source electrode and a drain electrode on the gate insulator; a fourth step of performing a surface preparation of the source electrode and the drain electrode with a compound having a functional group with an electron-withdrawing property; and a fifth step of forming a semiconductor film on the gate insulator, the film being between the source electrode and the drain electrode, a thin film transistor having a highly efficient carrier injection with a source electrode and a drain electrode of high work functions can be obtained even if a rare metal material is not used.

Further, in the case where surface preparation of a source electrode and a drain electrode using a compound having a functional group with an electron-withdrawing property including one of the compounds, a thiol compound, a disulfide compound, a sulfide compound and a silane coupling agent is performed, adhesion to a source electrode and a drain electrode is improved. Thereby, work functions of a source electrode and a drain electrode can be kept high over a long time. Therefore a thin film transistor having a stable and highly efficient carrier injection over time can be obtained.

Further, in the case where a source electrode and a drain electrode are formed using a material including at least one of Au and Ag, a thin film transistor with a source electrode and a drain electrode having high work functions can be manufactured without a rare metal. In addition, in the case where a compound having a functional group with an electron-withdrawing property includes one of the compounds, a thiol compound, a disulfide compound, a sulfide compound and a silane coupling agent, a thin film transistor can be manufactured, the transistor having an electrode material such as Au and Ag being chemically coupled with this compound having a functional group with an electron-withdrawing property.

Further, in the case where a source electrode and a drain electrode are formed by a printing method, a method for manufacturing a thin film transistor, wherein efficiency in the use of an electrode material is high, a large-sized display can be manufactured by using the transistor.

EXAMPLES

Example 1

At first, a PEN film was used as an insulating substrate 11. A nanosilver ink (Nanosilver made by Sumitomo Electric Industries: Polyethylene glycol #200 made by Aldrich=8:1 (ratio in weight)) was printed on the PEN film 11 by a reverse type offset printing method. A gate electrode 12 of 50 nm thickness was obtained after baking the printed matter at 180° C. for 1 hour. (See FIGS. 4(a)-(d)). The reverse type offset printing method is described below. A liquid film 22 of a nanosilver ink was formed on a blanket 21 made of a silicone rubber using a cap coater. In a condition of a room temperature, the film was preliminarily dried for two minutes. An unnecessary part 24 was removed by using a relief printing plate 23 having a pattern corresponding to a non-image part. An image part remaining on the blanket 21 was transformed to the insulating substrate 11.

A polyimide ink 31 (Neopulim made by Mitsubishi Gas Chemical) as a gate insulating film material was applied to the substrate by a die coater 32. Thereafter, a gate insulator 13 of 1 m thickness was formed by drying the substrate at 180° C. for 1 hour. (FIG. 5(a))

A silver paste 41 (a product of Sumitomo Electric Industries) was used as a material of a source electrode and a drain electrode. The paste was printed on the substrate by a screen printing device 42. A source electrode and a drain electrode 14 of 10 m were formed by drying the paste at 180° C. for 1 hour. (FIG. 5(b))

Next, the substrate was dipped in a surface preparation agent solution 52 for 2 hours. (FIG. 5(c)) The solution has 0.2 wt % of pentafluorothiophenol (a product of Tokyo Chemical Industry Co., Ltd.) which was diluted in isopropyl alcohol. The solution was in a container 51. Thereafter, the substrate was washed in isopropyl alcohol and was dried by an air gun. Thereby, surface preparation 15 was performed. (FIG. 5(d)) At this time, pentafluoro thiophenol was chemically coupled with Ag of an electrode material by an Ag-thiol reaction.

After surface preparation of this source electrode and drain electrode was performed, the work function of the electrode was measured using a photoelectron spectroscopic unit AC-1 (a product of RIKEN KEIKI Co., Ltd) at a condition where the voltage of an anode was 3340 V and measuring range was from 4 eV to 6 eV. As a result, a high value, that is, 5.40 [eV] was obtained.

Figure 5:
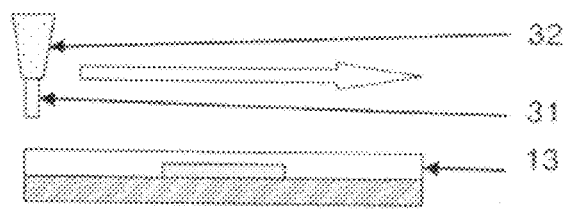
FIGS. 5(a)-(e) are an example of a method for manufacturing a thin film transistor of the present invention.
Figure 5:
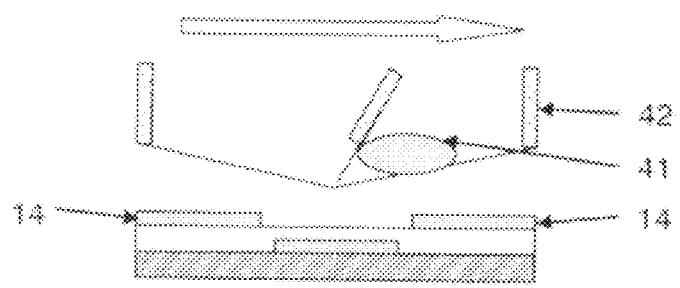
Figure 5:
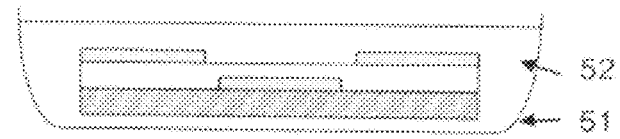
Figure 5:
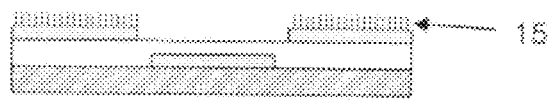
Figure 5:
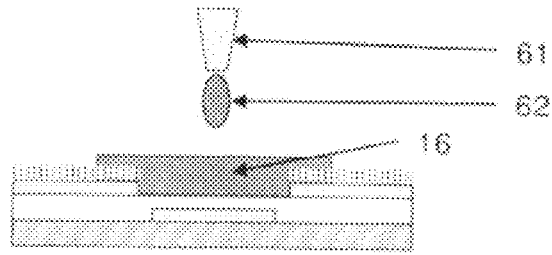

A semiconductor layer 16 was formed by the following processes (FIG. 5(e)): a solution 62 in which Liscon SP200 (a product made by Merck) was dissolved in tetralin (a product made by KANTO KAGAKU) so that Liscon SP200 was 0.5 weight % was used as a semiconductor material; the solution was applied by a dispenser 61; and the semiconductor layer 16 of 50 nm thickness was formed by drying the solution in a vacuum at 90° C. for 90 minutes. The work function of this semiconductor film 16 was measured using the same conditions as the above-mentioned conditions. As a result, the measured value was 5.18 [eV].

Figure 6:
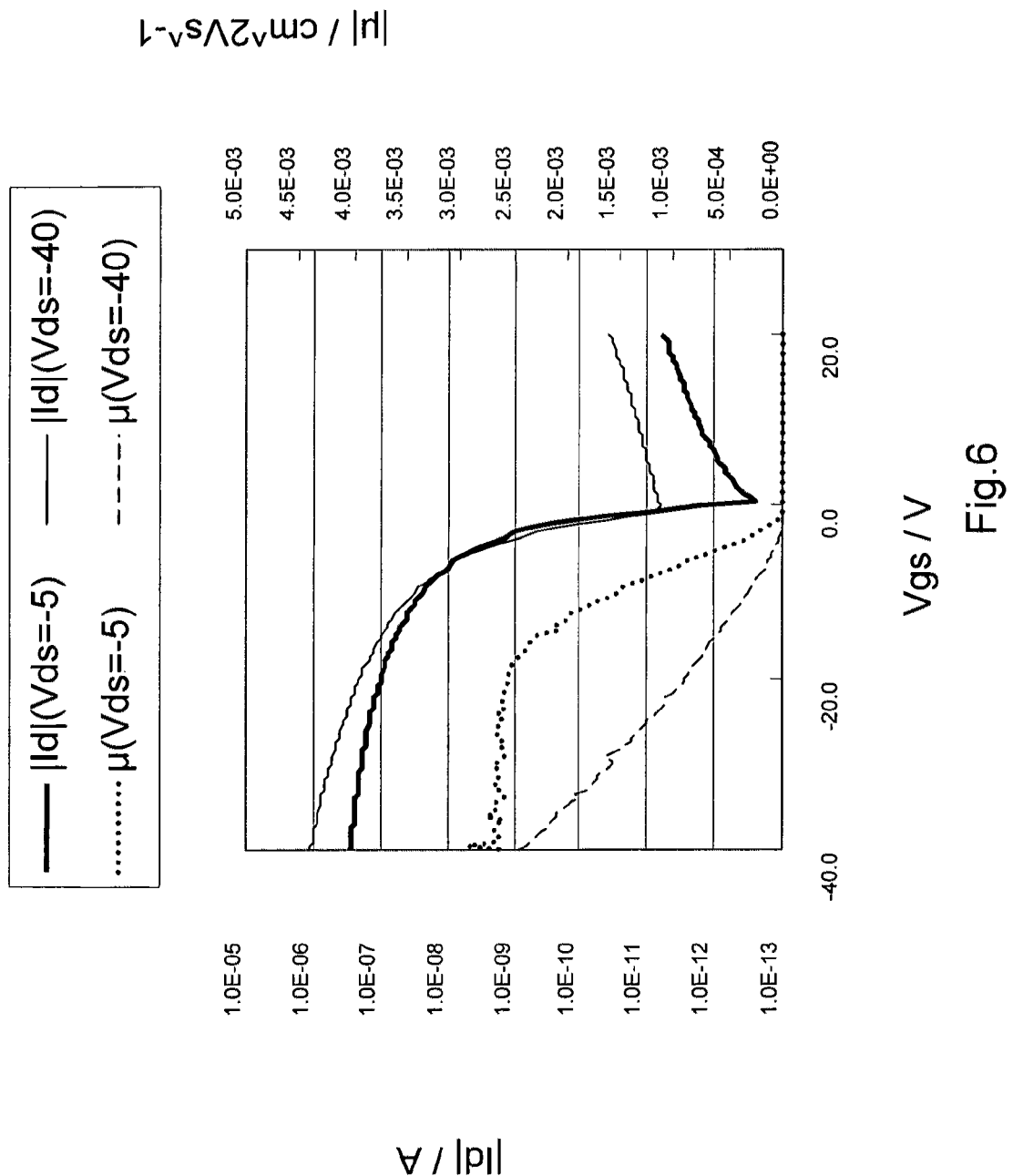
FIG. 6 shows the characteristics of a transistor of Example 1.

In the case of the formed thin film transistor, the relation between a voltage (Vgs), an electric current (|Id|) and a carrier mobility (| |) was measured using a semiconductor characteristics evaluation device SCS4200 (a product of Keithley Instruments Inc.). The results are shown in FIG. 6. Here, Vds means a voltage between a source electrode and a drain electrode. In FIG. 6, the maximum value of a carrier mobility at Vds=−5V was 2.82 E −3 [$cm^2$/Vs]. This value was high and preferable. (FIG. 15) This was because the work function of the electrode was higher than the work function of the semiconductor film. That is, surface preparation of the electrode was performed using a compound having a functional group with an electron-withdrawing property.

In addition, stability of the work function of the formed electrode was measured over time using a photoelectron spectroscopic unit AC-1 (a product of RIKEN KEIKI Co., Ltd)

using the same conditions as the above-mentioned conditions. After 2000 hours passed, the work function was 5.40 [eV] and was preferably not changed.

Example 2

Figure 7:
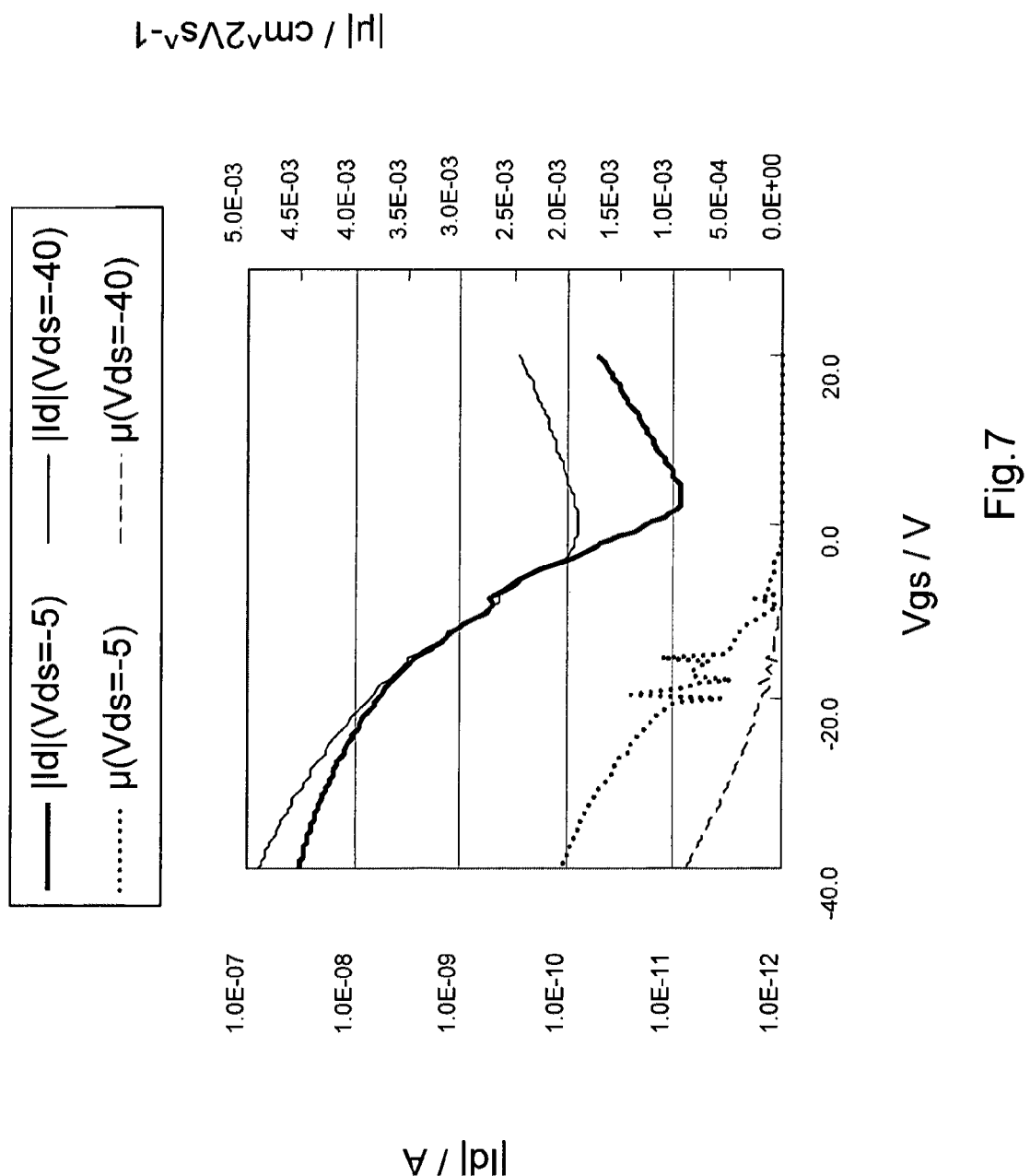
FIG. 7 shows the characteristics of a transistor of Example 2.

A thin film transistor was formed by the same method as Example 1 other than that a source electrode and a drain electrode were formed by the reverse type offset printing method using a nanosilver ink (Nanosilver made by Sumitomo Electric Industries: Polyethylene glycol #200 made by Aldrich=8:1 (ratio in weight) ). The work function of the electrode measured by the same method as Example 1 was 5.74 [eV]. This was a high value. (FIG. 14) In the case of the formed thin film transistor, the relation between a voltage (Vgs), an electric current (|Id|) and a carrier mobility (| |) was measured by the same method as Example 1. The results are shown in FIG. 7. In FIG. 7, the maximum value of a carrier mobility at Vds=−5V was 2.06 E −3 [cm$^2$/Vs]. This value was high and preferable. (FIG. 15) This was because the work function of the electrode was higher than the work function of the semiconductor film. That is, surface preparation of the electrode was performed using a compound having a functional group with an electron-withdrawing property. In addition, stability of the work function of the formed electrode was measured over time by the same method as Example 1. After 2000 hours passed, the work function was 5.74 [eV] and was preferably not changed.

Example 3

Figure 8:
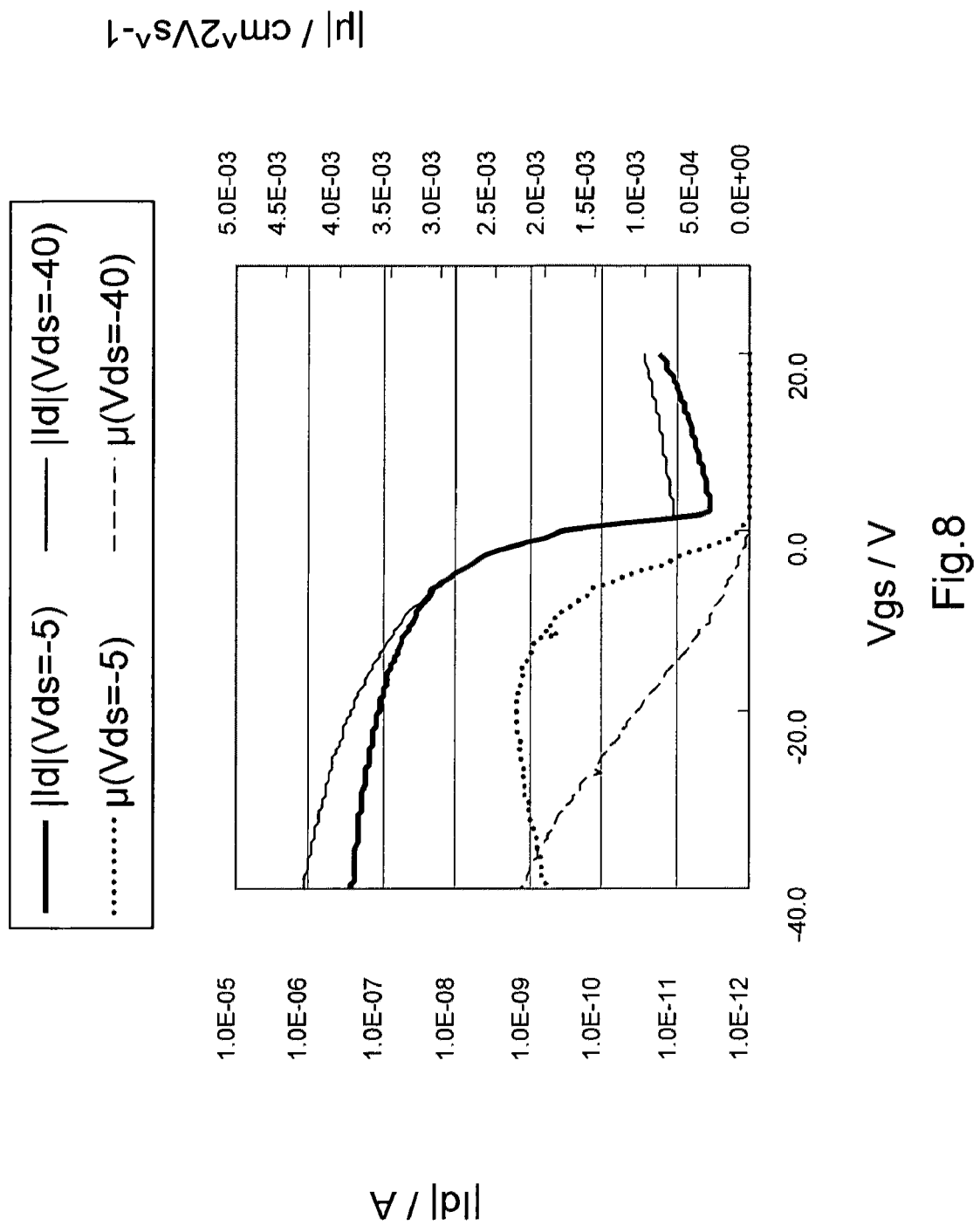
FIG. 8 shows the characteristics of a transistor of Example 3.

A thin film transistor was formed by the same method as Example 1 other than that a source electrode and a drain electrode were formed by an evaporation method, a photolithography method and an etching method using Au. The work function of the electrode measured by the same method as Example 1 was 5.49 [eV]. This was a high value. (FIG. 14) In the case of the formed thin film transistor, the relation between a voltage (Vgs), an electric current (|Id|) and a carrier mobility (| |) was measured by the same method as Example 1. The results are shown in FIG. 8. In FIG. 8, the maximum value of a carrier mobility at Vds=−5V was 2.29 E −3 [cm$^2$/Vs]. This value was high and preferable. (FIG. 15) This was because the work function of the electrode was higher than the work function of the semiconductor film. That is, surface preparation of the electrode was performed using a compound having a functional group with an electron-withdrawing property. In addition, stability of the work function of the formed electrode was measured over time by the same method as Example 1. After 2000 hours passed, work function was 5.49 [eV] and was preferably not changed.

Example 4

Figure 9:
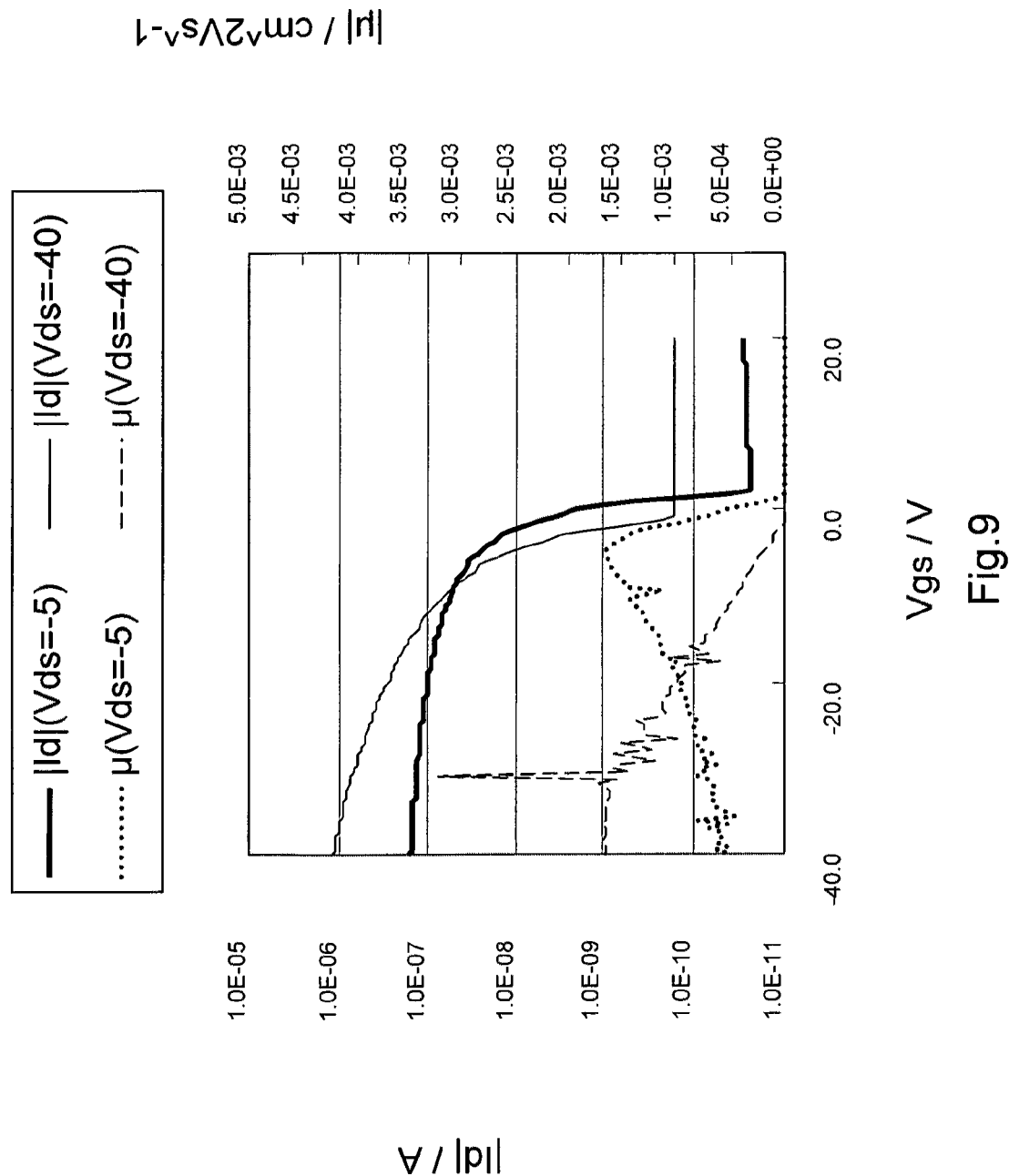
FIG. 9 shows the characteristics of a transistor of Example 4.

A thin film transistor was formed by the same method as Example 3 other than 5-chloro-2-mercaptobenzimidazole was used as a compound having a functional group with an electron-withdrawing property. The work function of the electrode measured by the same method as Example 1 was 5.26 [eV]. This was a high value. (FIG. 14) In the case of the formed thin film transistor, the relation between a voltage (Vgs), an electric current (|Id|) and a carrier mobility (| |) was measured by the same method as Example 1. The results are shown in FIG. 9. In FIG. 9, the maximum value of a carrier mobility at Vds=−5V was 1.66 E −3 [cm$^2$/Vs]. This value was high and preferable. (FIG. 15) This was because the work function of the electrode was higher than the work function of the semiconductor film. That is, surface preparation of the electrode was performed using a compound having a functional group with an electron-withdrawing property. In addition, stability of the work function of the formed electrode was measured over time by the same method as Example 1. After 2000 hours passed, the work function was 5.26 [eV] and was preferably not changed.

Example 5

Figure 10:
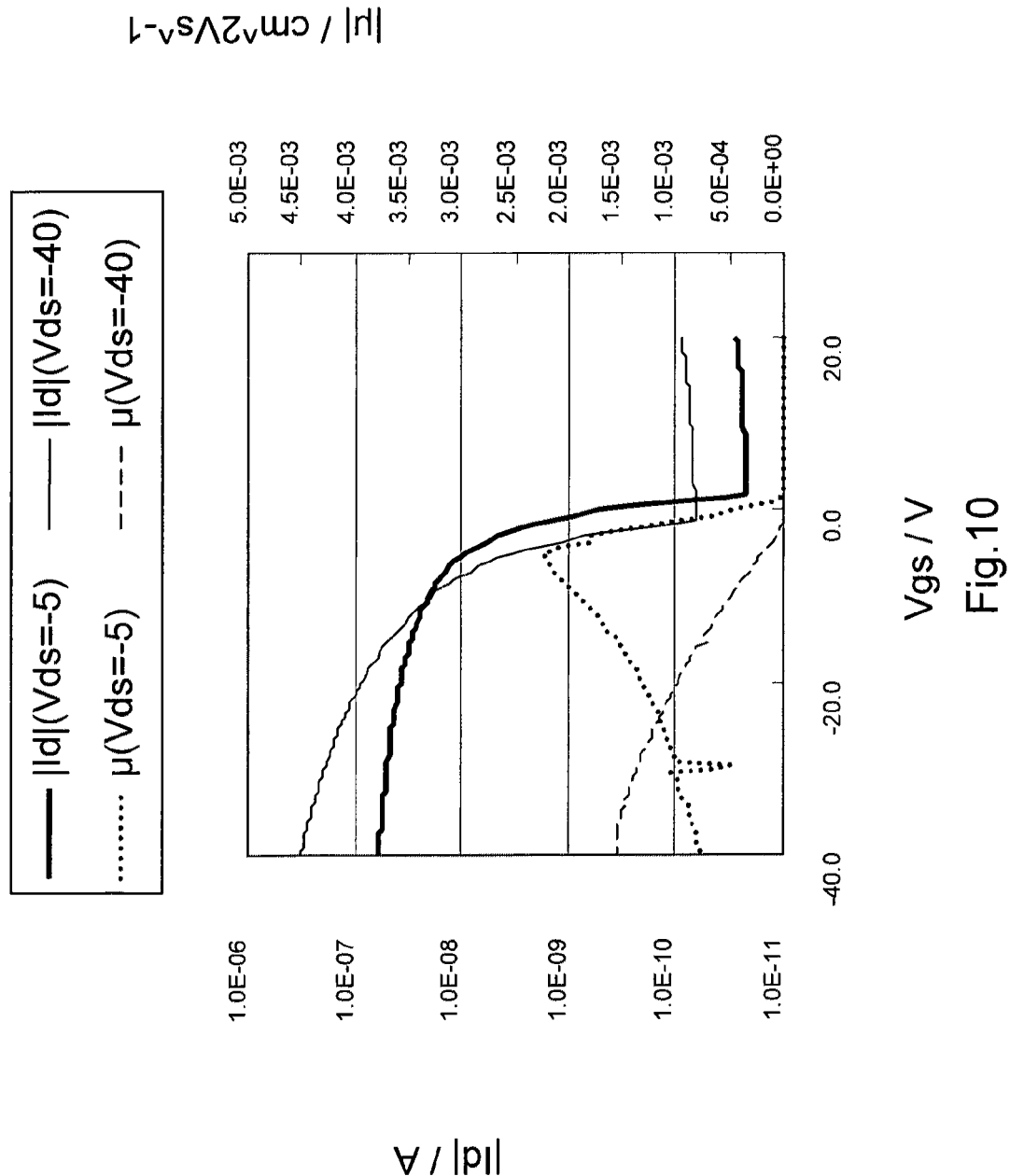
FIG. 10 shows the characteristics of a transistor of Example 5.

A thin film transistor was formed by the same method as Example 3 other than 4-trifluoromethyl-2,3,5,6-tetrafluorothiophenol was used as a compound having a functional group with an electron-attraction property. The work function of the electrode measured by the same method as Example 1 was 6.00 [eV]. This was a high value. (FIG. 14) In the case of the formed thin film transistor, the relation between a voltage (Vgs), an electric current (|Id|) and a carrier mobility (|μ|) was measured by the same method as Example 1. The results are shown in FIG. 10. In FIG. 10, the maximum value of a carrier mobility at Vds=−5V was 2.23 E −3 [cm$^2$/Vs]. This value was high and preferable. (FIG. 15) This was because the work function of the electrode was higher than the work function of the semiconductor film. That is, surface preparation of the electrode was performed using a compound having a functional group with an electron-withdrawing property. In addition, stability of the work function of the formed electrode was measured over time by the same method as Example 1. After 2000 hours passed, work function was 6.00 [eV] and was preferably not changed.

Comparative Example 1

Figure 11:
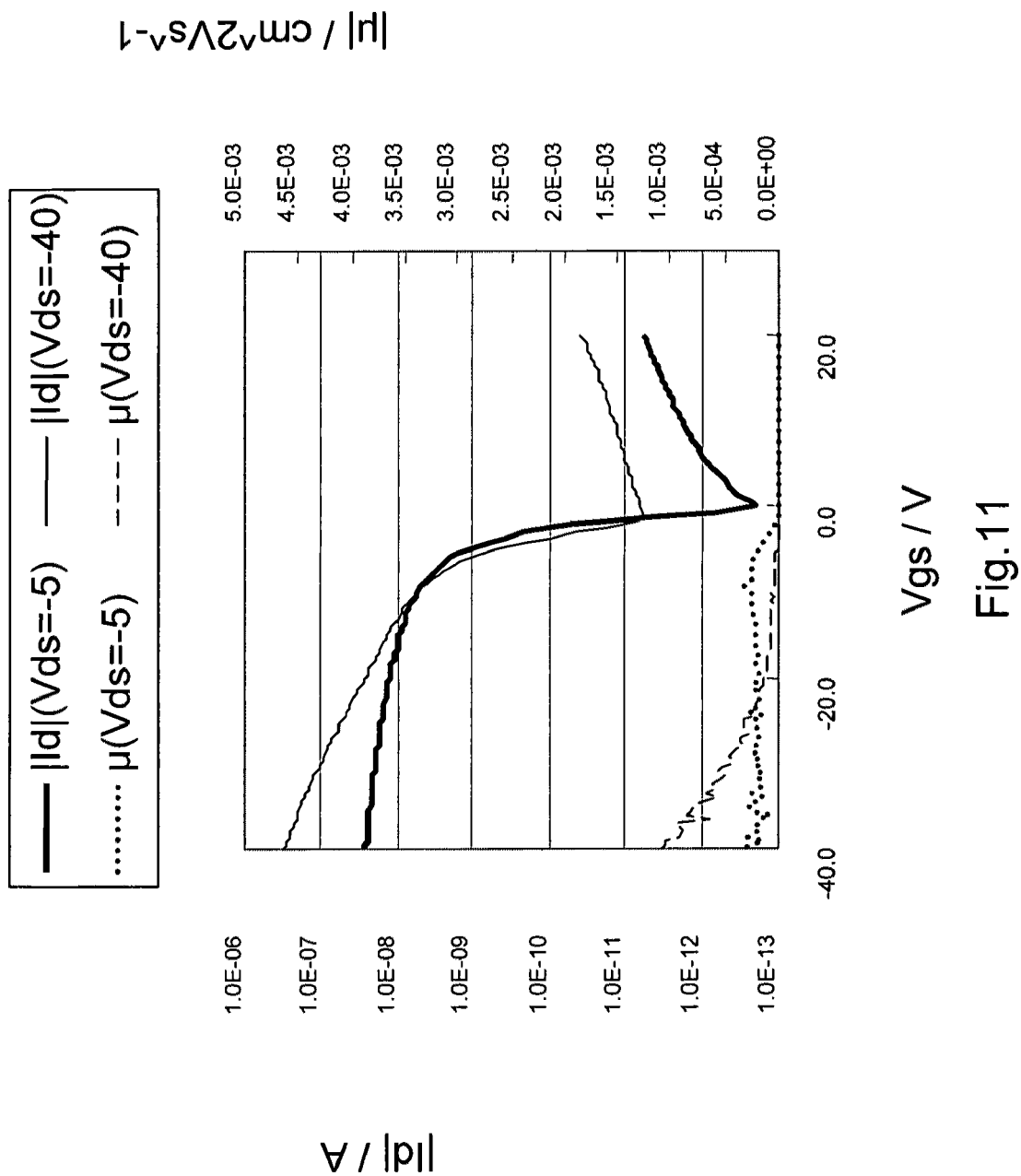
FIG. 11 shows the characteristics of a transistor of Comparative Example 1.

A thin film transistor was formed by the same method as Example 1 other than surface preparation of a source electrode and a drain electrode was not performed. A similar evaluation was performed. The work function of the electrode was small, that is, 4.75 [eV]. (FIG. 14) In the case of the formed thin film transistor, the relation between a voltage (Vgs), an electric current (|Id|) and a carrier mobility (|μ|) was measured. The results are shown in FIG. 11. In FIG. 11, the maximum value of a carrier mobility at Vds=−5V was 3.26 E −4 [cm$^2$/Vs]. This value was low. (FIG. 15) This was because the work function of the electrode was lower than the work function of the semiconductor film.

Comparative Example 2

Figure 12:
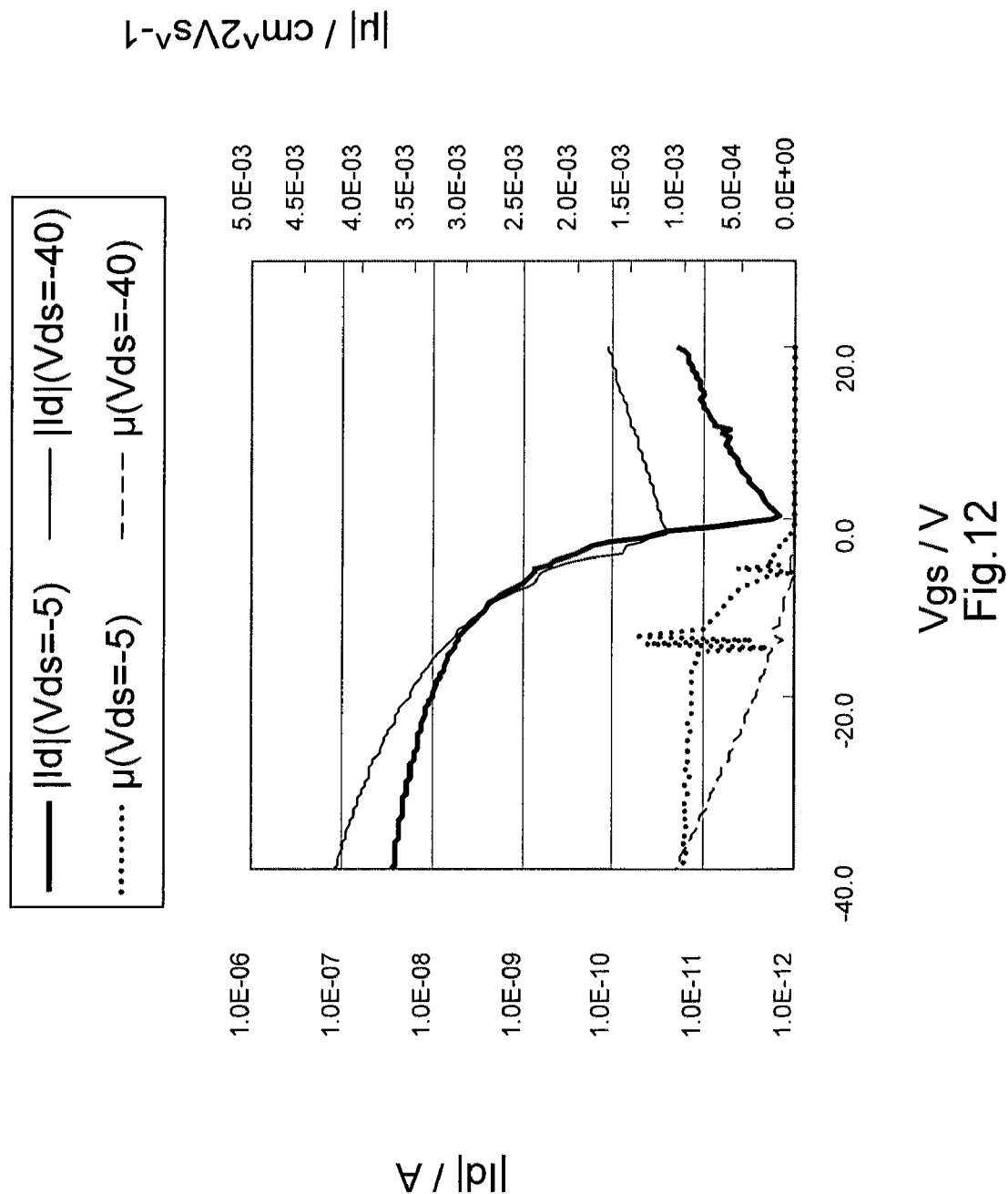
FIG. 12 shows the characteristics of a transistor of Comparative Example 2.

A thin film transistor was formed by the same method as Example 2 other than surface preparation of a source electrode and a drain electrode was not performed. A similar evaluation was performed. The work function of the electrode was small, that is, 4.74 [eV]. (FIG. 14) In the case of the formed thin film transistor, the relation between a voltage (Vgs), an electric current (|Id|) and a carrier mobility (|μ|) was measured. The results are shown in FIG. 12. In FIG. 12, the maximum value of a carrier mobility at Vds=−5V was 9.92 E −4 [cm$^2$/Vs]. This value was low. (FIG. 15) This was because the work function of the electrode was lower than the work function of the semiconductor film.

Comparative Example 3

Figure 13:
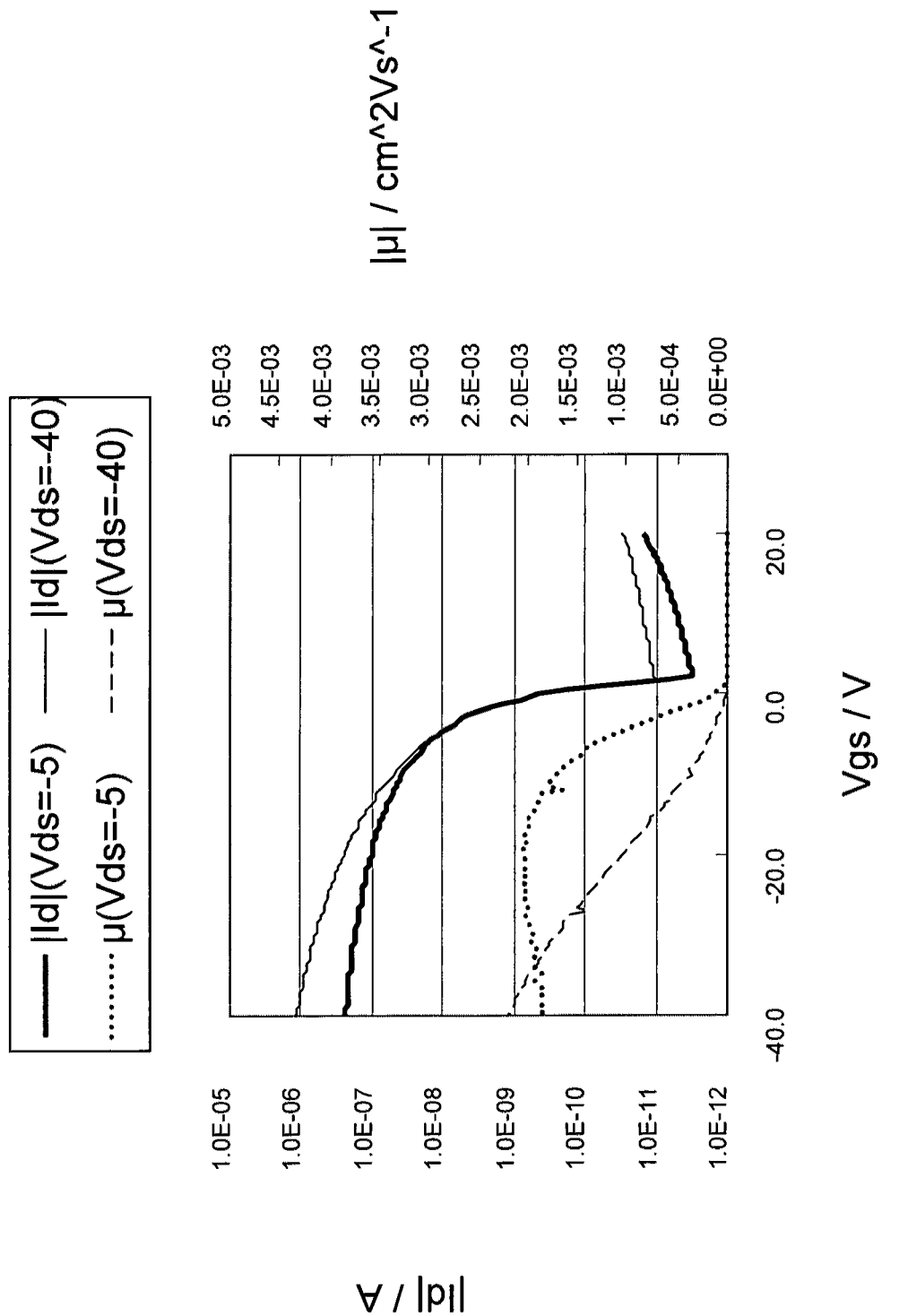
FIG. 13 shows the characteristics of a transistor of Comparative Example 3.

A thin film transistor was formed by the same method as Example 3 other than surface preparation of a source electrode and a drain electrode was not performed. A similar evaluation was performed. The work function of the electrode was small, that is, 4.60 [eV]. (FIG. 14) In the case of the formed thin film transistor, the relation between a voltage (Vgs), an electric current (|Id|) and a carrier mobility (|μ|) was measured. The results are shown in FIG. 13. In FIG. 13, the maximum value of a carrier mobility at Vds=−5V was 2.05 E −3 [cm$^2$/Vs]. This value was a little lower than the value in Example 3. (FIG. 15) This was because the work function of the electrode in which surface preparation was performed was higher than the work function of the electrode in which surface preparation was not performed.

What is claimed is:

1. A thin film transistor, comprising:
   an insulating substrate;
   a gate electrode and a gate insulator formed on said insulating substrate, in this order;
   a source electrode and a drain electrode formed on said gate insulator, surface preparation of said source electrode and said drain electrode being performed with a compound having a functional group with an electron-withdrawing property; and
   a semiconductor film formed on said gate insulator, said semiconductor film being formed between said source electrode and said drain electrode, wherein said compound having the functional group with the electron-withdrawing property includes a disulfide compound or a sulfide compound.

2. The thin film transistor according to claim 1, wherein said source electrode and said drain electrode are chemically coupled with said compound having the functional group with the electron-withdrawing property.

3. The thin film transistor according to claim 1, wherein said source electrode and said drain electrode include Ag.

4. The thin film transistor according to claim 1, wherein said semiconductor film is a p-type semiconductor film.

5. The thin film transistor according to claim 1, wherein said semiconductor film is an organic semiconductor film.

6. The thin film transistor according to claim 1, wherein said insulating substrate is a flexible substrate.

* * * * *